United States Patent
Knecht et al.

(10) Patent No.: US 7,724,109 B2
(45) Date of Patent: May 25, 2010

(54) BALL GRID ARRAY FILTER

(75) Inventors: Thomas A. Knecht, Dundee, IL (US); Glen Reeser, Palatine, IL (US); Reddy Vangala, Albuquerque, NM (US); Damon Niswonger, Ft. Wayne, IN (US)

(73) Assignee: CTS Corporation, Elkhart, IN (US)

( * ) Notice: Subject to any disclaimer, the term of this patent is extended or adjusted under 35 U.S.C. 154(b) by 317 days.

(21) Appl. No.: 11/598,320

(22) Filed: Nov. 13, 2006

(65) Prior Publication Data

US 2007/0109076 A1 May 17, 2007

Related U.S. Application Data

(60) Provisional application No. 60/737,544, filed on Nov. 17, 2005.

(51) Int. Cl.
*H01P 1/205* (2006.01)
*H01P 1/203* (2006.01)
(52) U.S. Cl. ........................ 333/204; 333/203
(58) Field of Classification Search ......... 333/203–205, 333/219, 246, 247
See application file for complete search history.

(56) References Cited

U.S. PATENT DOCUMENTS

| 4,431,977 | A | 2/1984 | Sokola et al. |
|---|---|---|---|
| 4,551,696 | A | 11/1985 | Moutrie et al. |
| 4,609,892 | A | 9/1986 | Higgins, Jr. |
| 4,785,271 | A | 11/1988 | Higgins, Jr. |
| 4,940,955 | A | 7/1990 | Higgins, Jr. |
| 4,963,843 | A | 10/1990 | Peckham |

(Continued)

FOREIGN PATENT DOCUMENTS

EP    0 675 539 A    10/1995

(Continued)

OTHER PUBLICATIONS

Pergola L. et al: "An LTCC-based 5-6 GHz Receiver with Integrated Antenna", 7th European Conference on Wireless Technology, 2004, Amsterdam, The Netherlands; Oct. 11-12, 2004, Piscataway, NJ, USA IEEE, Oct. 11, 2004, pp. 165-168, XP010771265 ISBN: 1-58053-991-2.

(Continued)

*Primary Examiner*—Benny Lee
*Assistant Examiner*—Gerald Stevens
(74) *Attorney, Agent, or Firm*—Daniel J. Deneufbourg (57) ABSTRACT

A ball grid array ceramic filter including a substrate having a ground layer of conductive material disposed over one of the surfaces thereof and a plurality of strips of conductive material on the other of the substrate surfaces defining resonators adapted to receive and pass RF signals. A plurality of vias extend through the substrate and define opposed ends terminating in the respective substrate surfaces. In one embodiment, a plurality of conductive spheres defining respective ground and RF signal input/output pads are disposed on the substrate surface with the ground layer thereon. Certain of the vias couple the resonators to the ground layer while others of the vias couple the resonators to respective spheres adapted for coupling to the respective RF signal input/output contacts on the top surface of a printed circuit board to which the filter is adapted to be direct surface mounted.

1 Claim, 7 Drawing Sheets

U.S. PATENT DOCUMENTS

| | | | |
|---|---|---|---|
| 5,057,803 A | 10/1991 | Ooi et al. | |
| 5,153,542 A | 10/1992 | Tai et al. | |
| 5,160,905 A | 11/1992 | Hoang | |
| 5,160,906 A | 11/1992 | Siomkos et al. | |
| 5,349,315 A | 9/1994 | Ala-Kojola | |
| 5,357,218 A * | 10/1994 | Wingfield et al. | 331/96 |
| 5,416,454 A | 5/1995 | McVeety | |
| 5,486,799 A | 1/1996 | Komazaki et al. | |
| 5,812,037 A | 9/1998 | Block | |
| 5,977,863 A | 11/1999 | Bloom et al. | |
| 5,994,978 A | 11/1999 | Vangala | |
| 6,005,777 A | 12/1999 | Bloom et al. | |
| 6,097,277 A | 8/2000 | Ginn et al. | |
| 6,194,979 B1 | 2/2001 | Bloom et al. | |
| 6,246,312 B1 | 6/2001 | Poole et al. | |
| 6,307,450 B2 * | 10/2001 | Takahashi et al. | 333/204 |
| 6,323,745 B1 * | 11/2001 | Toncich | 333/204 |
| 6,326,677 B1 | 12/2001 | Bloom et al. | |
| 6,329,890 B1 | 12/2001 | Brooks et al. | |
| 6,414,250 B1 * | 7/2002 | Inoue et al. | 174/261 |
| 6,559,735 B1 | 5/2003 | Hoang et al. | |
| 6,577,225 B1 | 6/2003 | Poole | |
| 6,664,874 B2 * | 12/2003 | Shirasaki | 333/247 |
| 6,791,403 B1 * | 9/2004 | Tayrani et al. | 327/565 |
| 6,856,516 B2 | 2/2005 | Ernsberger et al. | |
| 6,882,266 B2 | 4/2005 | Christian et al. | |
| 6,897,761 B2 | 5/2005 | Ernsberger et al. | |
| 6,900,708 B2 * | 5/2005 | White et al. | 333/185 |
| 6,911,882 B2 * | 6/2005 | Haruta et al. | 333/235 |
| 6,946,733 B2 | 9/2005 | Poole et al. | |
| 6,963,265 B2 | 11/2005 | Cooper et al. | |
| 7,411,474 B2 * | 8/2008 | Alford | 333/204 |
| 2004/0000968 A1 | 1/2004 | White et al. | |
| 2004/0160283 A1 | 8/2004 | Walter et al. | |
| 2005/0190017 A1 | 9/2005 | Hirabayashi | |

FOREIGN PATENT DOCUMENTS

| | | | |
|---|---|---|---|
| JP | 2003 309483 A | 10/2003 | |
| WO | WO 01/95679 A | 12/2001 | |

OTHER PUBLICATIONS

Den Otter, Adrianus, PCT International Search Report mailed Jun. 21, 2007 re: International Application No. PCT/US2006/044180 filed Nov. 14, 2006.

Den Otter, Adrianus, PCT Written Opinion of the International Searching Authority mailed Jun. 21, 2007 re: International Application No. PCT/US2006/044180 filed Nov. 14, 2006.

Lark Engineering Company, Surface Mount Combline Filters advertisement, RF Design Magazine, Apr. 2005, p. 7, Penton Media, Park Kansas, U.S.A., Reactel, Ultra Miniature Combline Filter advertisement, 2004.

* cited by examiner

BALL GRID ARRAY FILTER

CROSS-REFERENCE TO RELATED APPLICATIONS

This application claims the benefit of the filing date and disclosure of U.S. Provisional Application Ser. No. 60/737,544, filed on Nov. 17, 2005 which is explicitly incorporated herein by reference as are all references cited therein.

FIELD OF THE INVENTION

The present invention relates generally to radio frequency (RF) filters and, more particularly, to an improved ceramic substrate bandpass filter adapted to pass RF signals having frequencies in the range of 5.8 GHz or higher.

BACKGROUND OF THE INVENTION

Ceramic block filters offer several advantages over lumped component filters because they are relatively easy to manufacture, rugged, and relatively compact. In the basic ceramic block filter design as shown in, for example, U.S. Pat. No. 4,431,977 to Sokola et al. and U.S. Pat. No. 6,559,735 to Hoang and Vangala, resonators are formed by cylindrical passages, called through-holes, which extend through the block. The block is substantially plated with a conductive material (i.e., metallized) on all but one of its six (outer) sides and on the inside walls formed by the resonator holes.

One of the two opposing sides containing holes is not fully metallized, but instead bears a metallization pattern designed to couple input and output signals through the series of resonators. The reactive coupling between adjacent resonators is dictated, at least to some extent, by the physical dimensions of each resonator, by the orientation of each resonator with respect to the other resonators, and by aspects of the top surface metallization pattern.

Although these types of RF filters have received widespread commercial acceptance for RF frequencies of 5.8 GHz or lower, efforts at improving this basic design for RF frequencies above that level has continued. Specifically, and in the interest of allowing wireless communication providers to provide additional service, governments worldwide have allocated new higher RF frequencies for commercial use in, for example, wireless base stations, WiMax base stations, WLAN, and UWB (ultra wideband) consumer and infrastructure products. To better exploit these newly allocated frequencies, standard-setting organizations have adopted bandwidth specifications with compressed transmit and receive bands as well as individual channels. These trends are pushing the limits of currently available filter technology to provide sufficient frequency selectivity and band isolation.

The need thus continues for improved ceramic RF filters which can offer selectivity and other performance improvements at 5.8 GHz and higher, all in a lower cost, smaller, higher performance, and lower height package than the ceramic filters available today. This invention provides such an improved ceramic filter.

SUMMARY OF THE INVENTION

The present invention relates to a filter comprising a substrate having first and second surfaces where one of the first and second surfaces defines a ground plane and the other of the first and second surfaces defines a resonator pattern. A plurality of conductive vias extend through the substrate and define opposed ends terminating in the first and second surfaces respectively. A plurality of ground pads and at least first and second RF signal input/output pads are defined on one of the first and second surfaces.

In one embodiment, the resonator pattern is defined by a plurality of resonator strips defined on the first surface, the ground and RF signal input/output pads are defined on the second surface, and the ground plane is defined on the second surface. A first set of vias define ground vias extending between the ground plane and the first surface, and a second set of vias define RF signal input/output vias extending between the second surface and the resonator strips. A third set of vias define ground vias extending between the ground plane and the resonator strips. The third set of vias terminate in alternating opposed ends of the resonator strips.

A conductive ground strip may also be defined on the first surface of the substrate and selected ones of the ground vias may extend between the ground plane and the conductive ground strip.

A lid may be secured over the first surface and the conductive ground strip. The lid may include at least one aperture defined therein for laser trimming the resonator strips. The ground pads and RF signal input/output pads may be defined by solder spheres.

In a presently preferred specific embodiment, the present invention relates to a ball grid array filter adapted for direct surface mounting to the surface of a printed circuit board where the ball grid array filter comprises a substrate defining a first surface with a first ground layer of conductive material defining a ground plane and a second opposed surface with a plurality of generally spaced-apart and parallel strips of conductive material defining a resonator pattern.

A first set of conductive vias extends between the first ground layer of material on the first surface and the strips of conductive material on the second surface for grounding the strips of conductive material. A second set of conductive vias extends between the first surface and the strips of conductive material on the second surface and define an RF signal input/output transmission path. A first set of conductive ball grid array spheres, which may be made of copper, extends along and are seated on opposed first and second edges of the first ground layer of conductive material on the first surface. The first set of conductive spheres define ground pads adapted for contact with the ground pads on the surface of the printed circuit board.

A second set of conductive ball grid array spheres are seated on the first surface in contact with the second set of conductive vias and define RF signal input/output pads adapted for contact with the RF input/output contacts on the printed circuit board.

In this embodiment, at least two of the strips of conductive material on the second surface are located adjacent opposed side edges of the substrate and define fingers. The first ground layer of conductive material on the first surface additionally defines a pair of diametrically opposed notches formed in opposed side edges thereof. The second set of conductive vias define respective ends which terminate in the fingers in the strips of conductive material and the region of the first surface surrounded by the notches respectively. The second set of conductive spheres are seated on the first surface in a spaced relationship from the region of the first ground layer of material defining the respective notches and overlie the respective ends of the second set of vias terminating in the first surface to define an RF signal input/output path.

Moreover, each of the vias in the first set of conductive vias define ends terminating in alternating ends of the strips of conductive material on the second surface.

There are other advantages and features that will be more readily apparent from the following description of the invention, the drawings, and the appended exemplary claims.

BRIEF DESCRIPTION OF THE DRAWINGS

In the FIGURES.

DETAILED DESCRIPTION OF THE EMBODIMENT OF THE INVENTION

While this invention is susceptible to embodiments in many different forms, this specification and the accompanying drawings disclose only three preferred embodiments as examples of the present invention. The invention is not intended, however, to be limited to the embodiments so described.

First Embodiment

Figure 11:
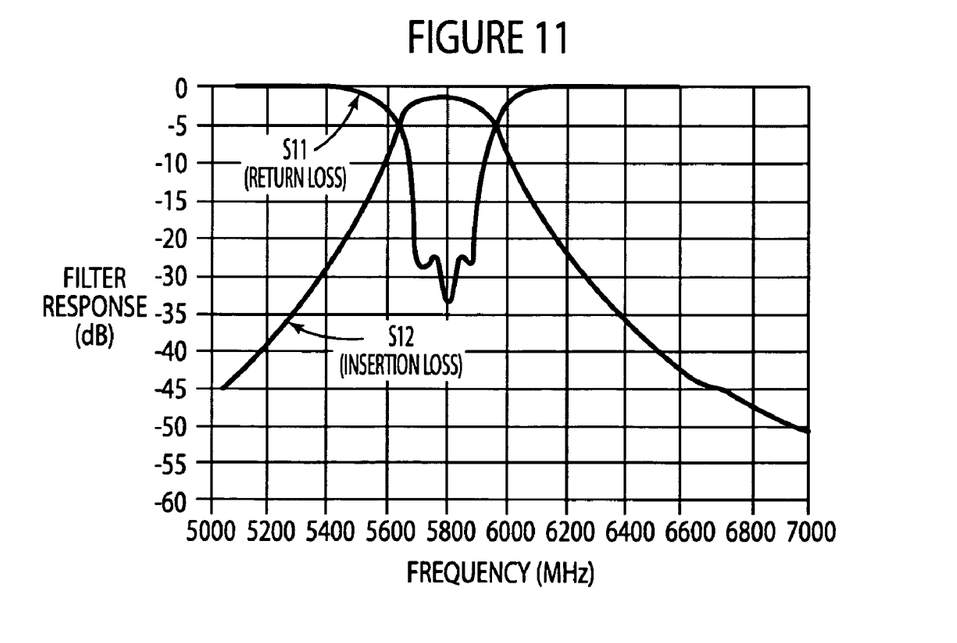
FIG. 11 is a frequency response graph depicting the performance of the ball grid array filter of the present invention.

FIGS. 1-6 depict a "top-side" construction or embodiment of a ceramic bandpass ball grid array (BGA) microstrip 3-pole filter 20 according to the present invention which, in the embodiment shown, measures about 6.0 mm×7.0 mm×1.5 mm (maximum) and has the operating specifications shown in FIG. 11 and summarized in Table 1 below.

TABLE 1

| Specifications | | Units |
|---|---|---|
| Frequency, Fo | 5800 | MHz |
| Bandwidth | 150 | MHz |
| Passband Insertion loss (max.) (S12) | 2.5 | dB |
| Ripple in passband (max.) | 1.8 | dB |
| Passband Return Loss (min.) (S11) | 15 | dB |
| Rejection @ +/−400 MHz | 20 | dB |
| Attenuation @ <5 GHz | 30 | dB |

TABLE 1-continued

| Specifications | | Units |
|---|---|---|
| Attenuation @ >6.2 GHz | 20 | dB |
| Ultimate attenuation | −55 | dB |
| VSWR max. in passband | 1.7:1 | |
| Size | 6.0 × 7.0 × 1.5 mm | mm |

The use of the term "top-side" is a reference to the side of the filter 20 opposite the bottom surface thereof adapted to be seated on the top surface of a customer's printed circuit board.

Figure 1:
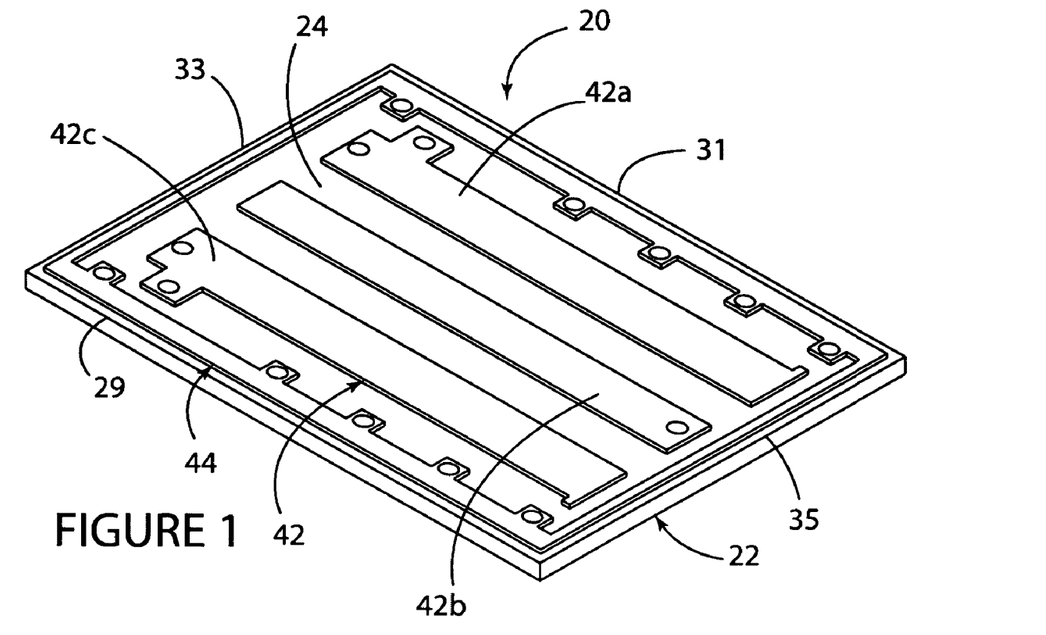
FIG. 1 is an enlarged perspective view of a "top-side" embodiment of a ball grid array filter in accordance with the present invention.
Figure 2:
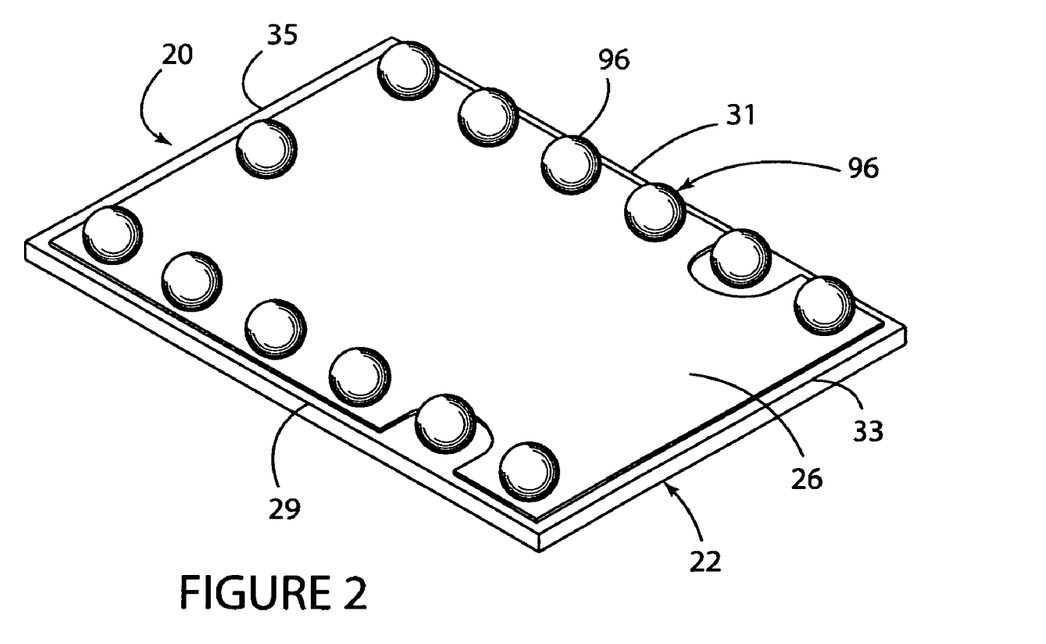
FIG. 2 is an enlarged perspective view of the bottom surface of the ball grid array filter of FIG. 1.

Filter 20 initially comprises a generally rectangularly-shaped ceramic substrate or block 22 composed of any suitable dielectric material that has relatively low loss, a relatively high dielectric constant, and a low temperature coefficient of the dielectric constant. In the embodiment of FIGS. 1 and 2, substrate 22 measures approximately 6.0 mm×7.0 mm; is about 20 mils (0.5 mm) thick, and is comprised of a ceramic compound which is about 96% aluminum oxide ($Al_2O_3$). In the preferred embodiment, substrate 22 has a Q of about 300 and a dielectric constant (K) of about 9.5.

Substrate 22 includes a top surface 24, a bottom surface 26, and side surfaces 28, 30, 32, and 34 (FIG. 5) defining peripheral side edges 29, 31, 33, and 35 respectively.

A plurality of generally cylindrically-shaped laser drilled through-holes defining conductive vias 36 (FIGS. 4 and 5) which, in the embodiment shown, are approximately 7-9 mils (0.18 mm to 0.23 mm) in diameter, are formed in and extend generally vertically through the body of substrate 22 between, and in a relationship generally normal to, the top and bottom surfaces 24 and 26. Vias 36 define ends terminating respectively in the top and bottom surfaces 24 and 26 of the substrate 22.

Although not depicted in any of the FIGURES, it is understood that the vias 36 are defined by respective through-holes which have been filled in with a suitable and conventional thick film conductive via fill material such as a Ag/Pd (silver/palladium) composition comprising about 99% silver and 1% palladium; having a conductivity of $4.3 \times 10^7$ mho/cm; a resistivity of 2.3 Mohm-cm; and a sheet resistance of 2.2 ohm/square.

The top surface 24 of filter 20 additionally includes a conductive metallization pattern 42 (FIGS. 1 and 5) defined by a plurality of resonator microstrips and a peripheral ground strip 44 (FIGS. 1 and 5) which have been formed on the top surface 24 of the substrate 22 by conventional thick film conductor processing techniques. Each of the resonator strips 42 and the ground strip 44 is likewise comprised of a suitable and conventional Ag/Pd conductive thick film material similar in composition to the material in vias 36.

Figure 5:
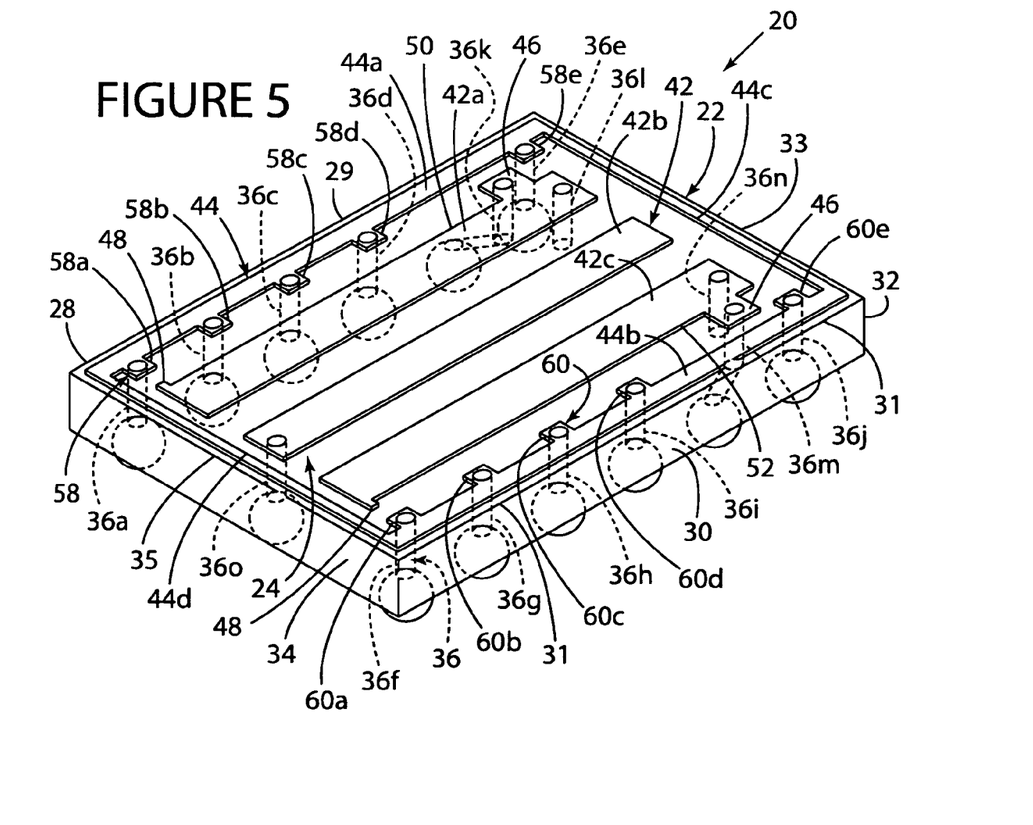
FIG. 5 is an enlarged perspective view of the filter of FIGS. 1 and 2 with the resonator conductive vias and ball grid array spheres shown in phantom.

As shown in FIGS. 1 and 5, resonator strip pattern 42 is defined by three separate elongate, generally rectangularly-shaped, conductive strips 42a, 42b and 42c extending between the long side edges 29 and 31 of substrate 22 in a spaced-apart and generally parallel relationship relative thereto and each other and in a generally normal and spaced-apart relationship relative to and between the short side edges 33 and 35 of substrate 22.

In the embodiment shown, the end resonator strips 42a and 42c are diametrically opposed mirror images of one another and the center resonator strip 42b is located therebetween.

In the embodiment shown, the resonator strips 42a and 42c are about 4.93 mm in length from the centerline of the ground via defined therein to the other end thereof and about 0.61 mm wide. The resonator strip 42b is 4.83 mm in length from the centerline of the ground via defined therein to the other end thereof. The spacing between the respective resonator strips is about 0.61 mm in the side-to-side direction between substrate side edges 31 and 35.

Each of the resonator end strips 42a and 42c additionally defines a pair of fingers or tabs 46 and 48 protruding generally normally outwardly from the respective outer side walls 50 and 52 of strips 42a and 42c in the direction of respective substrate long side edges 29 and 31. Fingers 46 and 50 are located at opposite ends of the respective strips 42a and 42c. Each of the fingers 46 and 48 is generally square-shaped. Finger 46 is spaced from the edge of the one end of each of the strips 42a and 42c, while the finger 48 is aligned with the opposite end of each of the strips 42a and 42c. Finger 46 is wider and longer than finger 48. Fingers 46 and 48 on respective strips 42a and 42c are diametrically opposed to one another. Fingers 46 define the RF signal input/output pads or sections of the respective resonator strips, while the fingers 48 are adapted to be used for laser trimming or to improve matching.

As is known in the art and disclosed in, for example, U.S. Pat. No. 4,418,324 to Higgins, electrical coupling between the conductive strips is achieved by means of fringing electromagnetic fields associated with each strip. The fringing electromagnetic field of a single strip affects adjacent strips to a degree dependent upon the physical distance between two adjacent strips. Each conductive strip defines a pole in the transfer function of the filter. In such filters, the exact frequency of the pole depends upon the relative configuration of the conductive strips which compose the filter and the dielectric constant of the material occupying the space between the strips.

Referring to FIGS. 1 and 5, ground strip 44 comprises a contiguous strip which extends around the periphery of the substrate top surface in a spaced-apart and parallel relationship relative to the substrate peripheral edges 29, 31, 33, and 35. More specifically, ground strip 44 defines a first pair of elongate, generally rectangularly-shaped side ground strip sections 44a and 44b and a second pair of elongate, generally rectangularly-shaped top and bottom ground strip sections 44c and 44d.

Ground strip sections 44a and 44b extend in a relationship generally parallel to the resonator strips 42a, 42b and 42c. Ground strip section 44a is located and positioned between, and spaced from, the long side edge 29 of substrate 22 and the sidewall 50 of resonator strip 42a in the transverse side-to-side direction. Ground strip section 44b is diametrically opposed from the ground strip section 44a and is located and positioned between, and spaced from, the long side edge 31 of substrate 22 and the sidewall 52 of resonator strip 42c in the transverse, side-to-side direction.

Each of the ground strip sections 44a and 44b in turn defines a plurality of generally rectangularly-shaped fingers or tabs 58 and 60 respectively which protrude outwardly from the respective inner side walls thereof and extend in the direction of the respective side outer walls 50 and 52 of resonator strips 42a and 42c respectively. The fingers 58 and 60 extend along the length of respective ground strip sections 44a and 44b in a spaced-apart and parallel relationship wherein fingers 58a and 60a are aligned with the fingers 48 of respective resonator strip 42a and 42c and the fingers 46 of respective resonator strips 42a and 42c extend between the fingers 58d and 58e of ground strip section 44a and the fingers 60d and 60e of ground strip section 44b respectively.

The ground strip section 44c extends in a transverse side-to-side direction between the top of ground strip sections 44a and 44b in a relationship spaced from, generally parallel to, and between the top ends of resonator strips 42a, 42b, and 42c and the substrate top edge 33.

Ground strip section 44d is diametrically opposed from ground strip section 44c and thus extends in a transverse side-to-side direction between the lower edges of ground strip sections 44a and 44b in a relationship spaced from, generally parallel to, and positioned between the lower ends of resonator strips 42a, 42b, and 42c and the substrate lower short side edge 35.

As described in more detail below, the peripheral ground strip 44 defines the positioning and grounding track or pattern for a lid 98 which is adapted to be fitted over the top surface 24 of substrate 22 as also described in more detail below.

Figure 4:
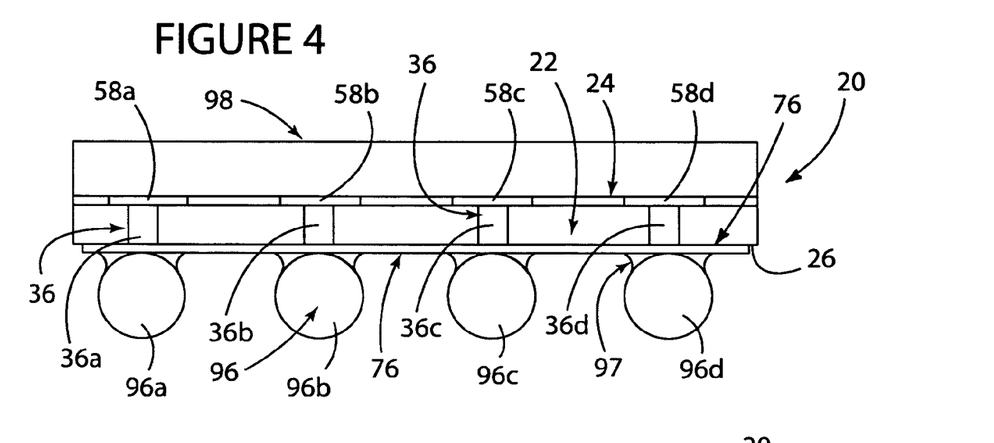
FIG. 4 is an enlarged vertical cross-sectional view of the filter of FIGS. 1 and 2 taken along the line 4-4 in FIG. 3 and further including a lid secured thereto.

As shown in FIGS. 4 and 5, vias 36 extend between the top and bottom surfaces 24 and 26 respectively of the substrate 22 in a relationship wherein the ends of the respective conductive vias terminate in portions of respective ones of the resonator strips 42a, 42b, and 42c and the fingers in ground strip 44 as described in more detail below.

Vias 36a-36e terminate in the fingers 58a-58e of the side ground strip section 44a. Vias 36f-36j terminate in the fingers 60a-60e of the opposite side ground strip section 44b.

Still another via 36k defines an end terminating in the finger 46 of resonator strip 42a. Another via 36l defining a resonator ground terminates in the top end of resonator strip 42a.

In a diametrically opposed manner, via 36m defines a first end terminating in the finger 46 of resonator strip 42c; and a via 36n, defining a resonator ground, terminates in the top end of resonator strip 42c.

Finally, a via 36o, also defining a resonator ground, terminates in the lower end of center resonator strip 42b.

Vias 36l, 36n, and 36o in strips 42a-42c define an interdigital filter where grounds between the strips and the ground plane are defined in alternating opposed ends of the respective resonator strips 42a, 42b, and 42c.

Figure 3:
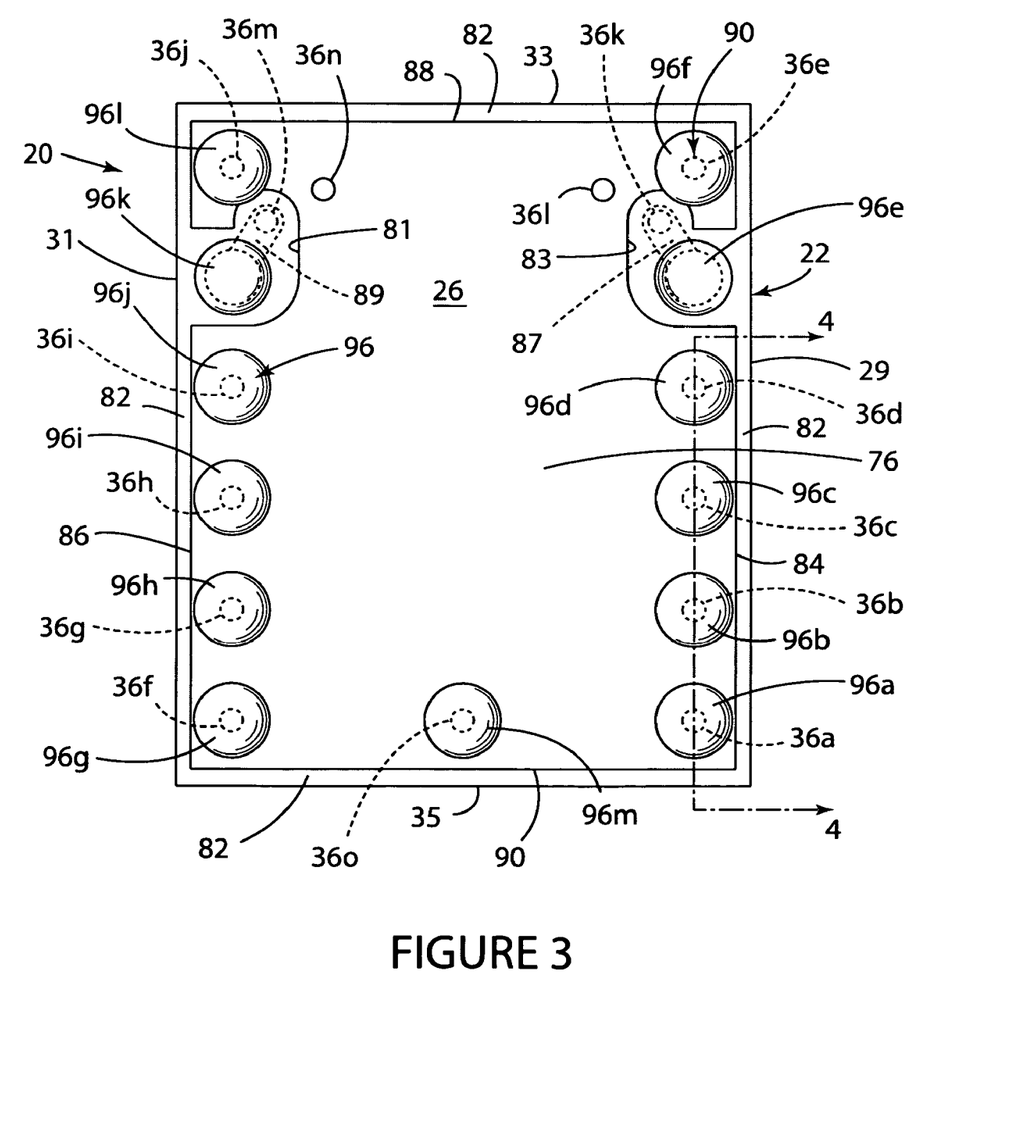
FIG. 3 is an enlarged bottom plan view of the filter of FIGS. 1 and 2.

As shown in FIGS. 2, 3 and 4, the bottom surface 26 of substrate 22 has a layer or strip 76 of conventional thick film conductor material formed thereon which defines a lower conductive ground plane covering substantially the entire bottom substrate surface 26 except for: two generally hook-shaped diametrically opposed areas or notches 81 and 83 defined therein adjacent the substrate long side edges 29 and 31 respectively which include respective conductive traces formed therein and defining the RF signal input/output pads 87 and 89 of the filter 20; and a continuous peripheral portion or strip 82 adjacent peripheral substrate side edges 29, 31, 33, and 35.

More specifically, conductive strip or layer 76 defines respective elongate peripheral edges 84, 86, 88, and 90, which are parallel to, and spaced from, the respective peripheral side edges 29, 31, 33, and 35 of the substrate 22.

The vias 36a-36e extend along the length of the substrate long side edge 29 in a spaced-apart and generally co-linear relationship and terminate in, and extend the length of, the long side longitudinal edge 84 of the ground layer 76.

The vias 36f-36j extend along the length of the opposed substrate side edge 31 in a spaced-apart and generally co-linear relationship and terminate along, and extend the length of, the opposite long side longitudinal edge 86 of the ground layer 76. Vias 36f-36j are diametrically opposed to vias 36a-36e.

Vias 36k and 36m terminate in the space on the substrate 22 surrounded by the respective notches 83 and 81 cut out of the ground layer 76 and, more specifically, in one end of the respective conductive traces 87 and 89.

Via 36o terminates in a central portion of the lower edge 90 of ground layer 76 and is positioned in a spaced-apart and generally co-linear relationship with vias 36a and 36f.

Vias 36l and 36n terminate in the ground layer 76 just to the inside of respective notches 83 and 81. Vias 36l and 36n are positioned in a diametrically opposed and generally co-linear relationship.

A plurality of solder spheres 96 (see FIGS. 2, 4 and 5), with a pitch of about 1.0 mm and a diameter of about 0.025 inches (0.64 mm), are mechanically and electrically attached to the bottom surface 26 of substrate 22. Spheres 96 are composed of any suitable high temperature solder material which does not reflow or change shape such as, for example, a 90% Pb and 10% Sn composition (or a lead-free copper with Sn/Ni plating composition if appropriate) and are adapted to allow the direct surface mounting of the filter 20 to the printed circuit board of, for example, a WiMax base station. Although not described in detail herein or shown in any of the drawings, it is understood that the spheres 96 could also take the form of pads or strips of conductive material.

A first set of solder spheres 96a-96f extend along the length of long side peripheral substrate edge 29, and between the top and bottom substrate edges 33 and 35 in spaced-apart and generally co-linear relationship. Solder spheres 96a-96d and 96f are adapted to be positioned and secured over the respective vias 36a-36d and 36e. Solder sphere 96e is adapted to be electrically coupled to the via 36k through conductive trace 87 extending therebetween.

A second set of solder spheres 96g-96l extend along the length of long side peripheral substrate edge 31, and between the top and bottom short side substrate edges 33 and 35 respectively, in a spaced-apart and generally co-linear relationship. Solder spheres 96g-96l are diametrically opposed to solder spheres 96a-96f. Solder spheres 96g-96j and 96l are adapted to be positioned and secured over the respective vias 36f-36i and 36j. Solder sphere 96k is adapted to be electrically coupled to the via 36m through conductive trace 89 located in the region of notch 81 and extending between the sphere 96k and the trace 89.

Solder sphere 96m is seated over the via 36o and thus is positioned in a spaced-apart and generally co-linear relationship with solder spheres 96a and 96g.

In accordance with the present invention, all of the solder spheres, except for the two solder spheres 96e and 96k, define respective ground pins or pads adapted to be electrically connected to the respective ground pads of the external printed circuit board to which the filter 20 is adapted to be direct surface mounted. Solder spheres 96e and 96k define the RF signal input and output pins or tap pads of filter 20 and are adapted for electrical coupling to the respective RF signal input and output pads of the external printed circuit board of the WiMax or the like base station to which the filter 20 is adapted to be direct surface mounted. Each of the conductive traces 87 and 89 extends between the respective solder spheres 96e and 96k and the respective vias 36k and 36m so as to define an RF signal electrical conductive input/output path between the spheres 96e and 96k on one surface 26 of the substrate 22 and the resonator strips 42 on the opposite surface 24 of the substrate 22.

Although not shown in any of the drawings or described herein in any detail, it is understood that the invention encompasses embodiments of the filter 20 in which the spheres 96 have been substituted with conductive flat pads.

In the embodiment of FIGS. 1-6, filter 20 additionally comprises a metal lid 98 (FIGS. 6A and 6B) which is preferably about 20 mils (0.5 mm high) and is adapted to be seated over and secured to the top surface 24 of substrate 22. In accordance with the present invention, and as shown in, for example, FIG. 4, lid 98 provides several functions including: providing an air gap above the resonator strips 42; functioning as a Faraday shield, thereby defining a ground plane above resonator strips 42; and acting as a dust cover for filter 20.

Figure 6A:
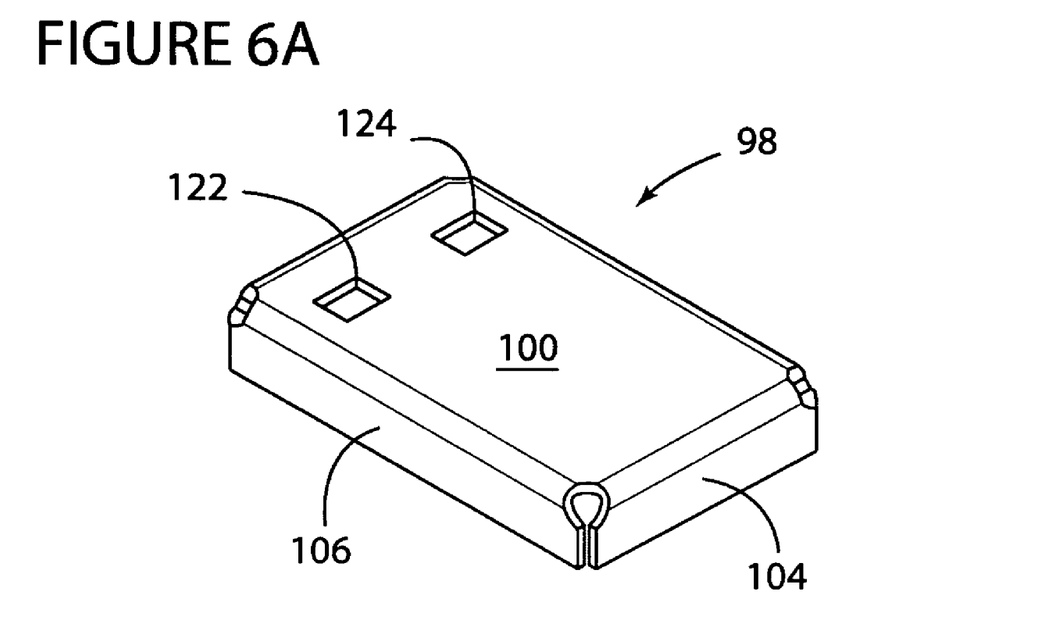
FIGS. 6A and 6B are respective top and bottom perspective views of the lid adapted to be secured to the top of the filter of FIGS. 1 and 2.
Figure 6B:
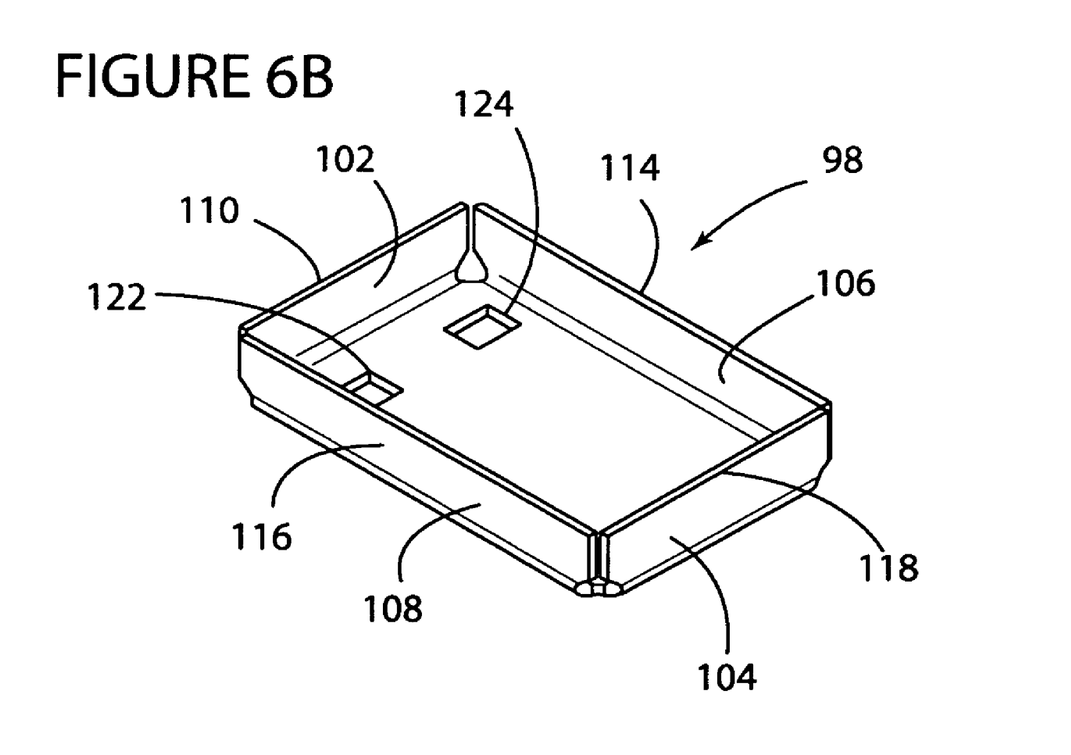

Lid 98 includes a top roof or surface 100 and four sidewalls 102, 104, 106, and 108 depending generally normally downwardly therefrom and defining respective peripheral end faces or edges 110, 112, 114, and 116. The roof 100 defines a pair of spaced-apart, co-linear laser trim apertures 122 and 124 positioned in a spaced-apart and parallel relationship relative to and adjacent the lid upper peripheral side wall 102.

Filter 20 is preferably assembled using the following process sequence: Initially, a substrate 22 is provided and through-holes are laser-drilled therethrough. Via fill material paste is then screened over each of the through-hole openings. Both of the surfaces 24 and 26 of the substrate 22 are then rolled to force the fill material through the through-holes so as to define the plurality of conductive vias 36. Substrate 22 is then fired in an oven at approximately 850° C. to cure the via fill material.

Resonator conductive strips 42 and lid ground/track conductive strip 44 are then subsequently formed on the top surface 24 of substrate 22 thereon as by, for example, a screening or plating process followed by firing in an oven at about 850° C. to cure the Ag/Pd conductive material. The same step is repeated for the ground layer 76 of Ag/Pd conductive material which is screened onto the bottom surface 26 of the substrate 22.

A generally translucent optional protective coating layer of dielectric material is then screen printed over the portion of the top surface 24 of the substrate 22 including said resonator strips 42 and the substrate 22 is again fired in an oven at about 850° C. to cure the coat layer of dielectric material. A similar protective coat of dielectric material is screen-printed onto substantially the entire substrate bottom surface 26 except for the area defining the RF signal input/output pads 78 and 80 and the ground balls. The substrate 22 is then again fired in an oven at about 850° C. to cure the bottom coat layer of dielectric material.

Solder paste is then screen printed over the lid ground strip 44 and the lid 98 is seated over the top surface 24 of substrate 22 in a relationship wherein the end faces 110, 112, 114, and 116 are seated over the respective side and top and bottom portions of ground strip 44. The solder is then reflowed to secure the lid 98 to the substrate 22.

Solder paste, generally designated with the numeral 97 in FIG. 4, is also screen printed over the ends of each of the respective vias defined in the bottom surface 26 of substrate 22 (see FIG. 4) and each of the points on the bottom surface 26 to which the respective solder spheres 96 are adapted to be attached. All of the solder spheres 96 are then seated over each of the points of solder paste and the solder paste is subsequently reflowed for permanently securing the solder spheres 96 to the substrate 22.

Resonator strips 42 on the upper surface 24 of substrate 22 and, more particularly, the fingers 48 thereof are adapted to be aligned with the apertures 122 and 124 in lid 96 so as to allow the strips 42 to be laser trimmed as necessary.

Finally, filter 20 is tested and then taped and reeled for shipment to the customer.

Second Embodiment

Figure 7A:
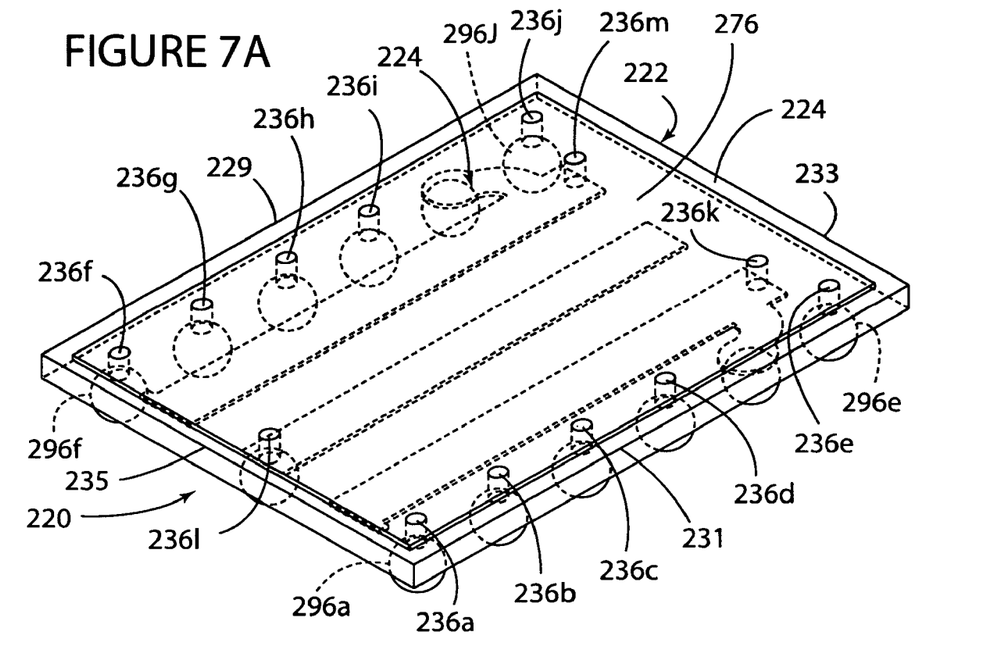
FIG. 7A is an enlarged, perspective view of the top surface of a "bottom-side" embodiment of a ball grid array filter in accordance with the present invention.
Figure 7B:
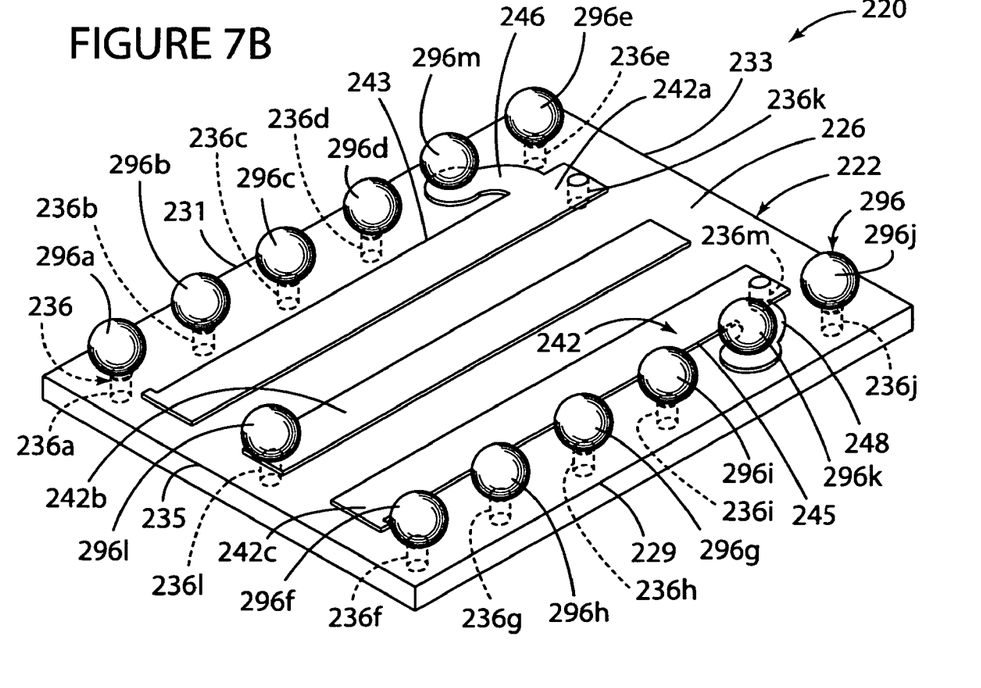
FIG. 7B is an enlarged perspective view of the bottom surface of the filter embodiment of FIG. 7A.

FIGS. 7A and 7B depict an alternate "bottom-side" filter embodiment 220 of the present invention. The use of the term "bottom-side" is a reference to the fact that the resonator pattern of filter embodiment 220 is located on the bottom-side or surface of the filter 220 adapted to face and be seated directly against the top surface of a customer's printed circuit board.

Initially, and as described earlier with respect to the filter embodiment 20, filter 220 likewise initially comprises a generally rectangularly-shaped substrate or block 222.

Substrate 222 preferably has the same dimensions and composition as the substrate 22 and thus the earlier discussion and description relating to substrate 22 is incorporated herein by reference.

Substrate 222 includes a top surface 224, a bottom surface 226, and side surfaces defining peripheral side edges 229, 231, 233, and 235 respectively.

A plurality of elongate laser drilled through-holes defining conductive vias 236 extend through the body of the substrate 222 and terminate in the top and bottom surfaces 224 and 226 respectively of the substrate 222. Vias 236 extend through the substrate 222 in a generally normal relationship relative to the top and bottom substrate surfaces 224 and 226.

Filter 220 differs in construction from filter 20 in that filter 220 includes both the solder spheres 296 and conductive resonator strips 242 appropriately positioned and located on the bottom substrate side/surface 226 of substrate 222 instead of the opposed top and bottom surfaces as in the filter 20. As a result, the process for making the filter 220 is similar to the process described earlier with respect to filter 20 and is thus incorporated herein by reference except that, of course, the process for making the filter 220 includes the steps of forming the ground plane 276 of the top surface 224, forming the resonator strips 242 on the bottom surface 226, and securing the solder spheres 296 to the bottom surface 226.

Specifically, and as shown in FIG. 7B, the bottom surface 226 of substrate 222 defines a resonator metallization pattern defined by three spaced-apart and parallel conductor/resonator strips 242a, 242b, and 242c which are generally rectangular in shape and have been formed thereon as known in the art and composed of the same type of thick film Ag/Pd conductor material as the conductor/resonator strips 42a, 42b, and 42c of filter 20.

Strips 242a, 242b, and 242c extend in a generally longitudinal direction between the top and bottom edges 233 and 235 of substrate 222 in an orientation generally normal to the short side substrate edges 233 and 235 and parallel to the substrate long side edges 229 and 231. Strips 242a, 242b and 242c are aligned in a spaced-apart and parallel relationship in the side-to-side, transverse direction between substrate long side edges 229 and 231.

The outer resonator strips 242a and 242c include respective diametrically opposed curvilinearly-shaped fingers or projections 246 and 248 defining respective RF signal input/output traces which are made of the same type of thick film conductor material as strips 242a and 242c. Projection 246 extends between the outer long side edge 243 of strip 242a and the long side edge 231 of substrate 222, while projection 248 on strip 242c extend between the outer long side edge 245 of strip 242c and the opposite long side edge 229 of substrate 222. Each of the projections 246 and 248 is positioned adjacent the top end of each of the strips 242a and 242c adjacent the substrate short side edge 233.

As shown in FIG. 7A, substrate 222 additionally includes a generally rectangularly-shaped layer 276 of thick film metallized material screened onto and covering essentially the entire area of the top surface 224 of substrate 222 and defining an upper conductive ground plane.

Substrate 222 additionally includes a plurality of ground conductive vias 236 defined therein which, in a manner similar to that described earlier with respect to the vias 36 of filter 20, extend in the longitudinal direction between, and in a direction generally normal to, the top and bottom surfaces 224 and 226 respectively of substrate 222. Vias 236 are adapted to be filled with the same type of thick film conductive material as the vias 36 defined in substrate 22 of filter 20.

A first plurality of vias 236a through 236e terminate in the bottom substrate surface 226 and extend along the length of the long side edge 231 of substrate 222 in a spaced-apart and co-linear relationship. Via 236e is located between the substrate edge 233 and the input/out pad 246. Vias 236a-236d are located between the input/output pad 246 and the substrate edge 235.

A diametrically opposed second set of vias 236f-236i terminate in the bottom substrate surface 226 and extend along the length of the opposite substrate long side edge 229 in a spaced-apart and co-linear relationship. Via 236j is located between the substrate edge 233 and the input/output pad 248. Vias 236f-236i are located between the input/output pad 248 and the peripheral substrate edge 235.

Substrate 222 also defines three additional vias 236k, 236l, and 236m. Via 236l terminates at one end in the lower end of the center resonator strip 242b. Via 236k defines a resonator ground terminating in the upper end of resonator strip 242a in a relationship adjacent and spaced from the input/output pad 246. Via 236m defines a resonator ground terminating in the upper end of resonator end strip 242c in a relationship adjacent and spaced from the opposite input/output pad 248.

The vias 236a-236m also terminate in the upper surface 224 of substrate 222 and are covered by the ground plane layer of conductive material 276. Via 238l is centrally located adjacent the substrate edge 235 in spaced-apart and co-linear relationship with vias 236a and 236f. Vias 238m and 238k are positioned in a diametrically opposed co-linear relationship adjacent the substrate short side edge 233 in a relationship to the interior of and below respective vias 236j and 236e respectively.

Filter 220 additionally comprises a plurality of solder spheres/balls 296a-296m secured to the bottom surface 226 of substrate 222. All of the solder spheres 296, but for solder spheres 296k and 296m, are adapted to be seated over and secured to respective filled ends of vias 236 in the same manner as described earlier with respect to the solder spheres/balls 96 of filter 20. In the embodiment shown, solder balls/spheres 296a-d, 296e, 296f-296i, 296j and 296l all define respective ground pins adapted to be positioned in direct surface contact with the respective ground pads of an external customer printed circuit board to which the filter 222 is adapted to be direct surface mounted.

Solder balls/spheres 296a-296e extend along the length of peripheral side edge 231 of substrate 222, and between the top and bottom substrate edges, in spaced-apart and generally co-linear relationship. Solder balls/spheres 296f-296j and 296k are respectively diametrically opposed to solder balls/spheres 296a-296e and 296m and extend along the length of the opposite peripheral side edge 229 of substrate 222, and between the top and bottom substrate edges, in spaced-apart and generally co-linear relationship.

Solder balls/spheres 296k and 296m are adapted to be seated over and secured to the distal end of the respective RF signal input/output pads 248 and 246. Pads 248 and 246 define respective conductive traces extending between the respective solder balls/spheres 296k and 296m and the respective resonator/conductor strips 242c and 242a, thus defining the input/output paths for the RF signal adapted to be transmitted through the filter 220.

Solder spheres 296a-296d are located between the bottom substrate short side edge 235 and the pad 246. Solder sphere 296e is located between the pad 246 and the top substrate short side edge 233. Solder spheres 296f-296k are located between the bottom substrate edge 235 and the pad 248. Solder sphere 296j is located between the pad 248 and the top substrate edge 233. Solder sphere 296l is centrally located along the bottom substrate edge 235 in a spaced-apart and generally co-linear relationship relative to solder spheres 296a and 296f.

In accordance with the present invention, the solder balls/spheres 296k and 296m define the respective input/output RF signal pins or pads of filter 222 adapted for direct surface mount contact with the respective input/output RF signal pads of the external printed circuit board on which the filter 222 is adapted to be direct surface mounted.

It is understood that, in the "bottom-side" construction of FIGS. 7A and 7B, the conductive layer 276 on the top surface 224 of substrate 222 comprises the first ground plane and that a customer's printed circuit board conductor pattern (not shown) provides the other required ground plane. The required air gap between the resonator and ground planes is provided and defined by the 0.025 inch space created by the solder spheres between the bottom surface of the filter and the customer's printed circuit board.

Third Embodiment

Figure 8:
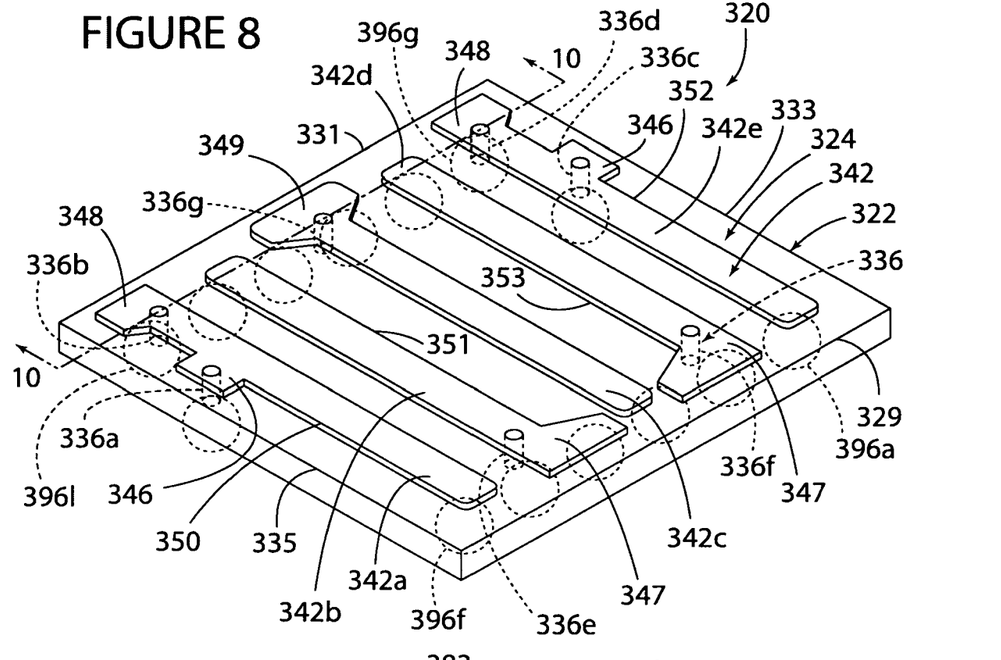
FIG. 8 is an enlarged perspective view of the top surface of another "top-side" embodiment of a ball grid array filter in accordance with the present invention.
Figure 9:
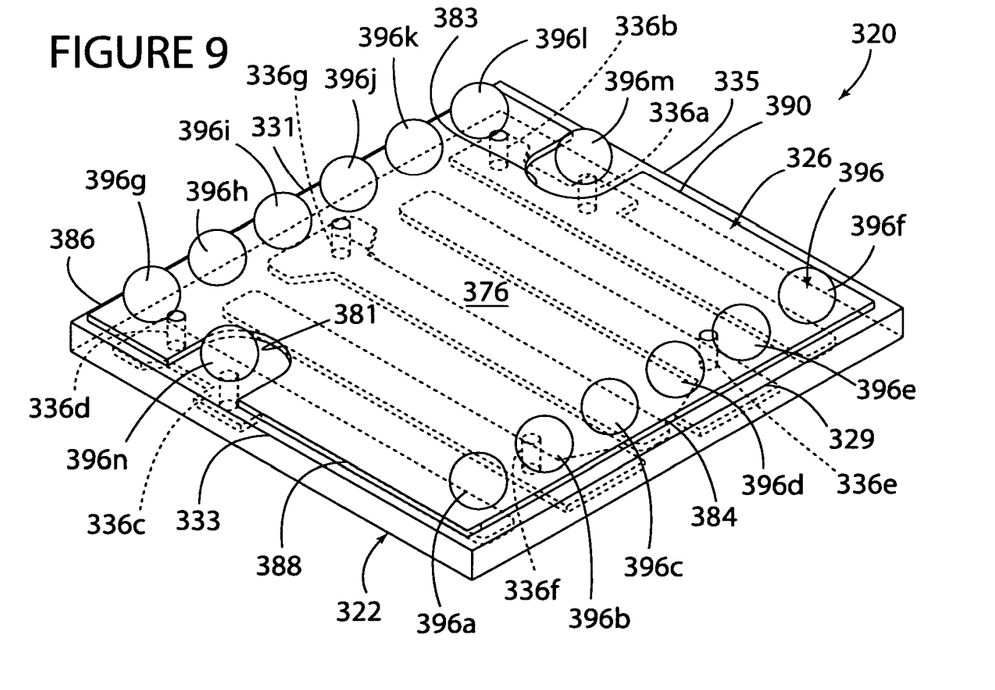
FIG. 9 is an enlarged perspective view of the bottom surface of the filter of FIG. 8.
Figure 10:
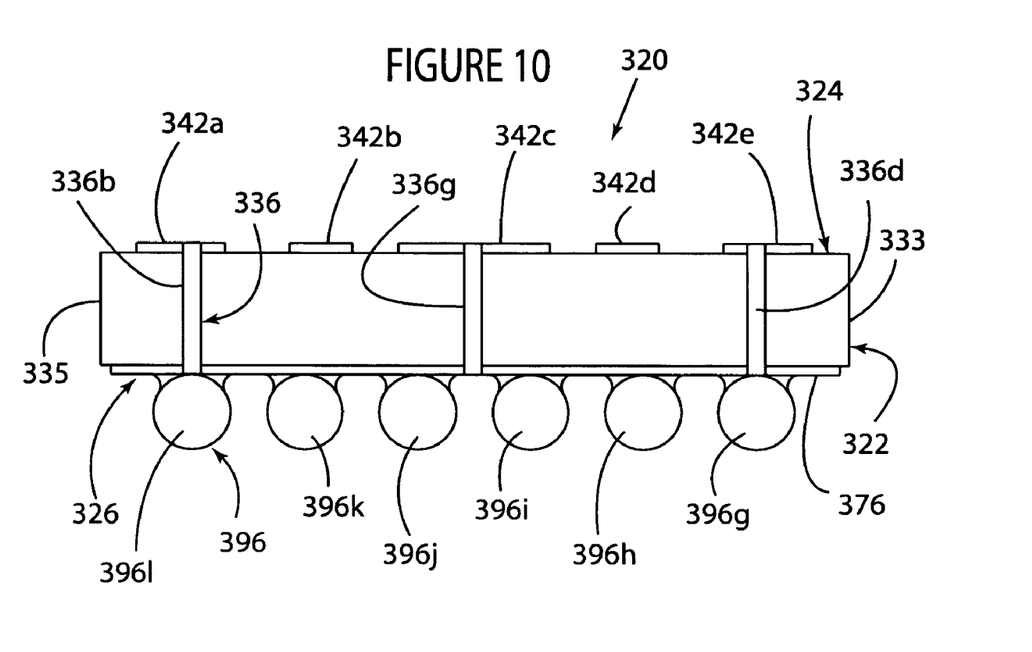
FIG. 10 is an enlarged cross-sectional view of the filter of FIGS. 8 and 9 taken along the line 10-10 in FIG. 8.

FIGS. 8-10 depict another "top-side" construction or embodiment of a 5-pole ceramic bandpass ball grid array (BGA) microstrip filter 320 according to the present invention. This example is a 6,500-7,900 MHz filter.

As with the earlier filter embodiments 20 and 220, filter 320 initially comprises a generally rectangularly-shaped ceramic substrate or block 322 composed of any suitable dielectric material material that has relatively low loss, a relatively high dielectric constant, and a low temperature coefficient of the dielectric constant. In the embodiment of FIGS. 8-10, substrate 322 measures approximately 6.0 mm×7.0 mm; is about 20 mils (0.5 mm) thick, and is comprised of a ceramic compound which is about 96% aluminum oxide ($Al_2O_3$). In the preferred embodiment, substrate 322 has a Q of about 300 and a dielectric constant (K) of about 9.5.

Substrate 322 includes a top surface 324, a bottom surface 326, and respective side surfaces defining peripheral long side edges 329 and 331, and short side edges 333 and 335 respectively.

A plurality of generally cylindrically-shaped laser drilled through-holes defining conductive vias 336 which, in the embodiment shown, are approximately 8 mils (0.20 mm) in diameter, are formed in and extend generally vertically through the body of substrate 322 between, and in a relationship generally normal to, the top and bottom surfaces 324 and 326 respectively. Vias 336 define respective termination ends in the top and bottom surfaces 324 and 326 respectively of the substrate 322 as described in more detail below.

Although not depicted in any of the FIGURES, it is understood that, in the same manner as filter embodiments 20 and 220, vias 336 are defined by respective through-holes which have been filled in with a suitable and conventional thick film conductive via fill material such as a Ag/Pd (silver/palladium) composition comprising about 99% silver and 1% palladium; having a conductivity of $4.3 \times 10^7$ mho/cm; a resistivity of 2.3 Mohm-cm; and a sheet resistance of 2.2 ohm/square.

The top surface 324 of filter 320 additionally includes a conductive metallization pattern 342 (FIGS. 8 and 10) defined by a plurality of resonator microstrips which have been formed on the top surface 324 of the substrate 322 by conventional thick film conductor processing techniques as described above in detail with respect to filter embodiments 20 and 220. Each of the resonator strips 342 is likewise comprised of a suitable and conventional Ag/Pd conductive thick film material similar in composition to the material in vias 336.

As shown in FIG. 8, resonator strip pattern 342 is defined by five separate elongate, generally rectangularly-shaped, conductive strips 342a, 342b, 342c, 342d and 342e extending between the short side substrate edges 333 and 335 of substrate 322 in spaced-apart and generally parallel relationship relative thereto and each other and in a generally normal and spaced-apart relationship relative to and between the long side edges 329 and 331 of substrate 322.

In the embodiment shown, the resonator strips 342a and 342b is diametrically opposed mirror images of resonator strips 342e and 342d respectively and the center resonator strip 342c is located therebetween.

In the embodiment shown, each of the resonator strips 342a and 342e is about 4.0 mm in length and about 0.45 mm wide. Each of the resonator strips 342b and 342d is about 3.70 mm in length and about 0.45 mm wide. Resonator strip 342c is about 3.80 mm in length and about 0.45 mm wide. The spacing/distance between resonator strips 342c and 342b and 342c and 342d respectively is 0.80 mm. The spacing/distance between resonator strips 342a and 342b and 342d and 342e respectively is 0.60 mm.

Each of the resonator end strips 342a and 342e additionally defines a pair of fingers or tabs 346 and 348 protruding generally normally outwardly from the respective outer side walls 350 and 352 thereof in the direction of, and adjacent to, respective substrate short side edges 335 and 333. Fingers 346 and 348 are located adjacent to, and are oriented in a relationship generally parallel to, the substrate long side substrate edge 331. Fingers 346 protrude outwardly from the respective outer edges 350 and 352 of respective strips 342a and 342e in the direction of respective short side substrate edges 335 and 333. Finger 348 protrudes outwardly from one of the ends of each of the respective resonator strips 342a and 342e in the direction of substrate long side edge 331. Fingers 348 are formed and located below fingers 346. Fingers 346 and 348 on respective strips 342a and 342e are diametrically opposed to one another. As discussed in more detail below, the fingers 346 define the input/output pads or sections of the respective resonator strips, while the fingers 348 define ground pads as described in more detail below.

Each of the diametrically opposed resonator strips 342b and 342d defines a finger or tab 347 protruding generally normally outwardly from the respective inner side walls 351 and 353 thereof. Fingers 347 protrude outwardly from the respective ends of resonator strips 342b and 342d opposite the ends of respective strips 342a and 342c with fingers 346. Thus, it is understood that respective fingers 347 are diametrically opposed mirror images of each other and are oriented and located in a spaced-apart and adjacent relationship to the substrate long side edge 329.

Center resonator strip 342c defines a finger or tab 349 extending outwardly in the direction of substrate long side edge 331 from the end thereof opposite the end of strips 342b and 342d defining fingers 347. Thus, finger 349 is oriented and located in a relationship generally adjacent and spaced from substrate long side edge 331.

In a manner similar to that described earlier with respect to filter embodiments 20 and 220, it is understood that electrical coupling between the conductive resonator strips 342a-342e is achieved by means of fringing electromagnetic fields associated with each of the resonator strips. The fringing electromagnetic field of a single strip affects adjacent strips to a degree dependent upon the physical distance between two adjacent strips. Each conductive strip defines a pole in the transfer function of the filter. In such filters, the exact frequency of the pole depends upon the relative configuration of the conductive strips which compose the filter and the dielectric constant of the material occupying the space under the strips.

As shown in FIGS. 8 and 10, a plurality of vias 336 extend between the opposed surfaces 324 and 326 respectively of the substrate 322 in a generally normal relationship relative to the upper and lower surfaces 324 and 326 wherein the ends of the respective conductive vias terminate in portions of respective ones of the resonator strips 342a-342e as described in more detail below.

More specifically, via 336a defines a first end terminating in the finger 346 of resonator strip 342a. Via 336b defines a first end terminating in the end/finger 348 of resonator 342a.

In a similar manner, via 336c defines a first end terminating in the finger 346 of resonator strip 342e while via 336d defines a first end terminating in the end/finger 348 of resonator 342e. Vias 336c and 336d are positioned in a diametrically opposed relationship to vias 336a and 336b respectively.

Via 336e defines a first end terminating in the end/finger 347 of resonator strip 342b. In a similar manner, via 336f defines a first end terminating in the end/finger 347 of resonator strip 342d and is positioned in a diametrically opposed relationship to via 336e which terminates in resonator strip 342b.

Via 336g defines a first end terminating in the end/finger 349 of center resonator strip 342c.

The respective vias in combination define an interdigital filter where grounds are defined in alternating opposed ends of the respective resonator strips 342a-342e.

As shown in FIGS. 9 and 10, the bottom surface 326 of substrate 322 has a layer or strip 376 of conventional thick film conductor material formed thereon and defining a lower conductive ground plane which covers substantially the entire bottom substrate surface 326 except for two generally semi-oval-shaped diametrically opposed areas or notches 381 and 383 defined therein adjacent the substrate short side edges 333 and 335 respectively and in a spaced-apart, adjacent relationship relative to substrate long side edge 331.

More specifically, conductive strip or layer 376 defines respective elongate peripheral edges 384, 386, 388, and 390, which are parallel to, and spaced from, the respective peripheral side edges 329, 331, 333, and 335 of the substrate 322.

The vias 336b, 336g, and 336d extend along the length of the substrate long side edge 331 in a spaced-apart and generally co-linear relationship and define respective second ends terminating in the long side longitudinal edge 386 of the ground layer 376. Vias 336e and 336f extend along the length of the opposed substrate long side edge 329 in a spaced-apart and generally co-linear relationship and define respective second ends terminating in the opposite long side longitudinal edge 384 of the ground layer 376.

Vias 336a and 336c define respective second ends terminating in the space on the lower substrate surface 326 which is surrounded by the respective notches 381 and 383 cut out of the ground layer 376.

In accordance with the present invention, vias 336b, 336g, 336d, 336e, and 336f all define vias which ground the respective resonator strips 342a-342e to the ground layer 376 on the lower surface 326 of substrate 322. Vias 336a and 336c, on the other hand, define conductive vias adapted to pass the RF input and output signals in and out of the filter 320 through the respective resonator strips.

A plurality of solder spheres 396, with a pitch of about 1.0 mm and a diameter of about 0.025 inches (0.64 mm), are mechanically and electrically attached to the bottom surface 326 of substrate 322 and, more specifically, to the ground layer 376. In the same manner as spheres 96 and 296, spheres 396 are composed of any suitable high temperature solder material which does not reflow or change shape such as, for example, a 90% Pb and 10% Sn composition (or a lead-free copper with Sn/Ni plating composition if appropriate) and are adapted to allow the direct surface mounting of the filter 320 to the printed circuit board of, for example, a WiMax base station. Although not described in detail herein or shown in any of the drawings, it is understood that the spheres 396 could also take the form of pads or strips of conductive material.

A first set of solder spheres 396a-396f are attached to and extend along the long side peripheral edge 384 of ground layer 376 in a generally spaced-apart and co-linear relationship.

A second set of solder spheres 396g-396l are attached to and extend along the opposed long side edge 386 of ground layer 376 in a generally spaced-apart and co-linear relationship. Solder spheres 396g-396l are diametrically opposed to solder spheres 396a-396f respectively.

An additional solder sphere 396m is seated over the second end of via 336a terminating in the space on the surface 326 defined by notch 383. Solder sphere 396n, which is positioned and oriented in a diametrically opposed relationship to solder sphere 396m, is seated over the second end of the via 336c terminating in the space on the surface 326 defined by notch 381.

In accordance with the present invention, all of the solder spheres, except for the two solder spheres 396m and 396n, define respective ground pins or pads adapted to be electrically connected to the respective ground pads of the external printed circuit board to which the filter 320 is adapted to be direct surface mounted. Solder spheres 396m and 396n, on the other hand, define the RF signal input and output pins or tap pads of filter 320 and are adapted for electrical coupling to the respective RF signal input and output pads of the external printed circuit board of the WiMax or the like base station to which the filter 320 is adapted to be direct surface mounted.

These 5-pole interdigital filters can be tuned after being fabricated. A laser operation, or manual abrading, of the thick film conductive material will tune the filter to specification, if necessary.

Although not shown in any of the drawings or described herein in any detail, it is understood that the invention encompasses embodiments of the filter 320 in which the spheres 396 have been substituted with conductive flat pads and/or where the filter 320 additionally comprises an optional metal lid similar to the lid 98 described earlier.

Numerous variations and modifications of the embodiment described above may be effected without departing from the spirit and scope of the novel features of the invention. No limitations with respect to the specific module illustrated herein are intended or should be inferred.

For example, it is understood that filter performance is a function of a variety of factors such as: the width of the resonator strips; the length of the resonator strips; the shape of the resonator strips; the number of resonator strips; the location and relationship and position of the resonator strips relative to one another; the location and relationship between the respective signal and ground tap points on the respective strips; the value of the dielectric constant of the ceramic substrate material; the thickness of the ceramic substrate material; the length, diameter, location and/or number of vias extending through the substrate material; and the distance between the lid and substrate surface.

Thus, it is understood that the invention is not limited to the particular resonator and ground strip patterns depicted herein but also to any and all such variations of these patterns, vias, etc., which may be necessary for a particular application.

For example, it is understood that the performance and/or operational characteristics of any one or more of the filter embodiments described above can be optimized by tuning any one of the filters following manufacture but prior to shipment to the customer.

More specifically, and as it relates for example to the subject of the filter 320 shown in FIGS. 8-10, it is understood that the filter may be tuned by removing and/or slicing off portions of the thick film material defining any one of the resonator strips 342a-342e thereof. Although the thick film material can be removed and/or sliced off from any portion of any of the strips including, but not limited to, the ends and/or side edges thereof, it is understood that the thick film material is preferably adapted to be removed and/or sliced off one or more of the non-grounded distal ends of any one or more of the resonator strips 342a-342e. The present invention contemplates the use of any available means and method for tuning including laser ablation and/or manual abrasion.

What is claimed is:

1. An interdigital, microstrip filter comprising:
  a) a dielectric substrate having first and second outside surfaces and defining a peripheral edge, said first outside surface defining a ground plane and said second outside surface including a plurality of conductive resonator strips extending along the substrate in spaced-apart relationship, two of the plurality of resonator strips defining end resonator strips extending along opposed edges of the substrate and at least three additional interior resonator strips extending between said two end resonator strips, each of said plurality of resonator strips including a respective tab defined at one of the ends thereof, one of the interior resonator strips defining a center interior resonator strip including the tab defined at one end thereof and at least two of the other interior resonator strips including the tabs thereof defined at respective ends thereof opposite the end of the center resonator strip including said tab, the one of the ends of each of the plurality of resonator strips including said respective tab being devoid of any internal cutouts and each of the tabs protruding outwardly from the respective ends of the respective resonator strips and having a width greater than the width of the respective resonator strips;
  b) a plurality of conductive ground and RF signal input/output vias extending through said substrate and terminating in said plurality of resonator strips, said RF signal input/output vias terminating in said end resonator strips respectively and said plurality of ground vias terminating in alternating ends of said plurality of resonator strips respectively to define said interdigital filter;
  c) a plurality of ground pads defined on said first surface; and
  d) at least first and second RF signal input/output pads defined on said first surface and coupled to said RF signal input/output vias respectively.

\* \* \* \* \*